(12) United States Patent
Sarti

(10) Patent No.: US 11,342,788 B1
(45) Date of Patent: May 24, 2022

(54) SYSTEM AND METHOD FOR IN-RACK GENERATION OF ALTERNATING CURRENT VOLTAGE DURING POWER GRID OUTAGES

(71) Applicant: R-Stor Inc., Saratoga, CA (US)

(72) Inventor: Pierluigi Sarti, Milpitas, CA (US)

(73) Assignee: R-Stor Inc., Saratoga, CA (US)

( * ) Notice: Subject to any disclaimer, the term of this patent is extended or adjusted under 35 U.S.C. 154(b) by 135 days.

(21) Appl. No.: 16/898,311

(22) Filed: Jun. 10, 2020

Related U.S. Application Data

(60) Provisional application No. 62/860,679, filed on Jun. 12, 2019.

(51) Int. Cl.
| | |
|---|---|
| H02J 9/06 | (2006.01) |
| H02M 7/515 | (2007.01) |
| G06F 1/18 | (2006.01) |
| G06F 1/30 | (2006.01) |

(52) U.S. Cl.
CPC .............. *H02J 9/062* (2013.01); *G06F 1/189* (2013.01); *G06F 1/30* (2013.01); *H02M 7/515* (2013.01)

(58) Field of Classification Search
CPC ............ H02J 9/062; G06F 1/189; G06F 1/30; H02M 7/515
See application file for complete search history.

(56) References Cited

U.S. PATENT DOCUMENTS

| | | | | |
|---|---|---|---|---|
| 5,898,291 | A * | 4/1999 | Hall ...................... | H02J 7/0029 320/121 |
| 6,369,461 | B1 * | 4/2002 | Jungreis .............. | H01M 16/003 307/46 |
| 9,622,373 | B1 * | 4/2017 | Sarti ..................... | H05K 7/1492 |
| 10,852,796 | B2 * | 12/2020 | Messick ................... | G06F 1/30 |
| 2012/0013186 | A1 * | 1/2012 | Sarti ......................... | G06F 1/30 307/23 |
| 2013/0154365 | A1 * | 6/2013 | Sarti ....................... | H02J 9/061 307/23 |
| 2015/0177808 | A1 * | 6/2015 | Sarti ......................... | G06F 1/30 713/300 |
| 2017/0074946 | A1 * | 3/2017 | Ebrahimzadeh ...... | G01R 31/386 |
| 2017/0098956 | A1 * | 4/2017 | Sarti ......................... | H02J 9/08 |
| 2017/0164505 | A1 * | 6/2017 | Sarti .................... | H01R 25/142 |
| 2017/0332510 | A1 * | 11/2017 | Sarti ........................ | H02M 7/06 |
| 2017/0373584 | A1 * | 12/2017 | Hiyama ................. | H02M 1/08 |
| 2018/0067528 | A1 * | 3/2018 | Wang .................... | H02J 7/0014 |
| 2018/0301930 | A1 * | 10/2018 | Gonzalez ................. | H02J 3/46 |
| 2020/0321668 | A1 * | 10/2020 | Xiong ................. | H01M 10/633 |

\* cited by examiner

*Primary Examiner* — Aurel Prifti

(74) *Attorney, Agent, or Firm* — Rankin, Hill & Clark LLP

(57) ABSTRACT

A system and apparatus for generating alternating current voltage during power grid outages and methods for making and using the same. In various embodiments, the system can provide backup power within IT environments and other mission-critical facilities among other things.

13 Claims, 10 Drawing Sheets

16KVA (powers 1x 15KW IT Rack)
Input 3phase 2 x 208VAC Plugs, Output 3phase 2 x 208VAC Outlets
Efficiency: > 95% (full load rack)
Li-ion batteries (6~8 years EOL)
Full Load Runtime: 10 min NEW BATTERIES
Rack Mount Space Utilization: 4U

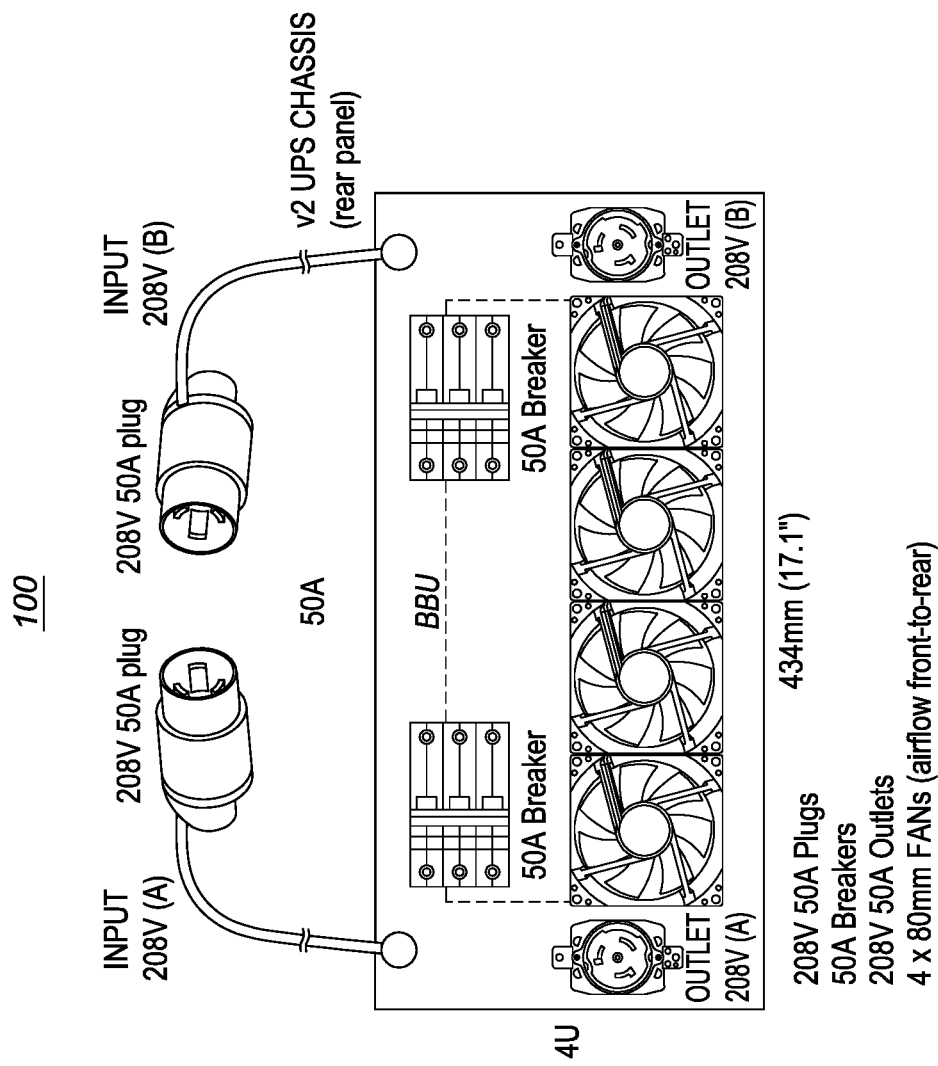
FIG. 4D
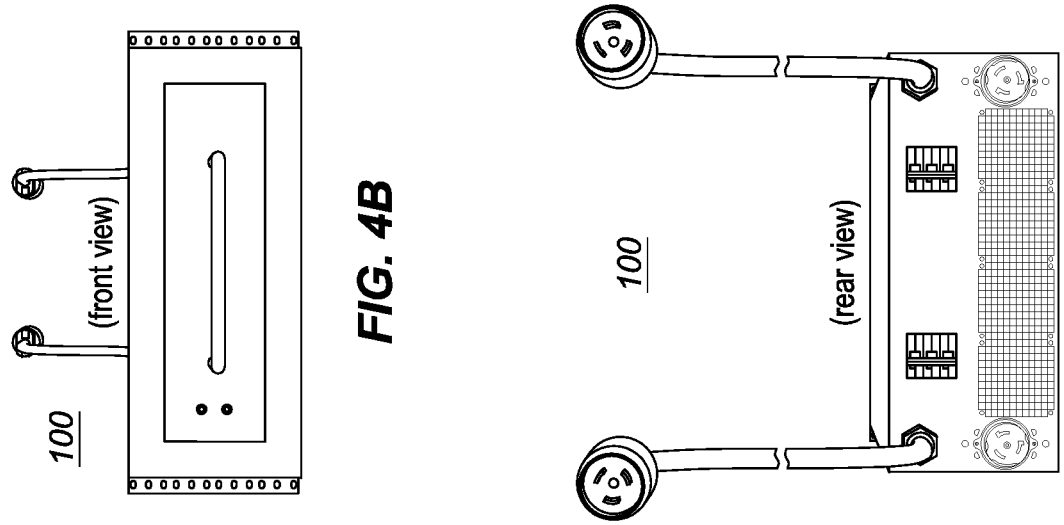
FIG. 4B
FIG. 4C

SYSTEM AND METHOD FOR IN-RACK GENERATION OF ALTERNATING CURRENT VOLTAGE DURING POWER GRID OUTAGES

CROSS-REFERENCE TO RELATED APPLICATIONS

This application claims the benefit of, and priority to, U.S. Provisional Application Ser. No. 62/860,679, filed Jun. 12, 2019, the disclosure of which is hereby incorporated herein by reference in its entirety and for all purposes.

FIELD

The disclosed embodiments relate to electrical power generation systems and more particularly, but not exclusively, to systems and methods for generating alternating current voltage during power grid outages.

BACKGROUND

A standard solution for avoiding service interruption within a mission-critical facility, such as an information technology (IT) environment, during alternating current (AC) power grid outages is installation of an Uninterruptible Power Supply (UPS) system within the facility. The UPS system thereby can provide continuity of the AC power to equipment and other loads within the facility should such a power outage occur. Legacy and current data centers, for example, normally are provided with centralized UPS systems that can provide backup power to the entire data center during power outages.

Conventional UPS systems typically supply backup power to one or more pieces of equipment within the facility. These UPS systems typically are in one of two system types: online type UPS systems, and offline type UPS systems. Online type UPS systems generate and provide continuity of AC power during normal operations when the power from the grid is available as well as during power hiccups, sags, interruptions and other types of outages; whereas, offline type UPS systems are able to switch their own generated AC output power to the facility equipment only during power outages. Generally, online type UPS systems are less efficient and more costly, but more reliable, than offline type UPS systems. The output power supplied by both types of UPS systems is, or is identical to, the AC grid power.

The AC voltage used in infrastructures and data centers typically is 208V Line-to-Line or 200-240V Line-to-Neutral. The term 'Line' commonly refers to one of the three legs of the standard three-phase voltage; while, the term 'Neutral' is a center point at which terminations of the three lines are connected. In Line-to-Neutral systems, for example, the Lines can be provided in a convention Wye configuration, as shown in FIG. 1A, in which the AC voltage can be utilized as Line-to-Line voltage, or Line-to-Neutral voltage with the Neutral termination being available at the load. Alternatively, Line-to-Line systems can be configured in a conventional Delta arrangement, as illustrated in FIG. 1B, in which the AC voltage is always utilized as Line-to-Line voltage and the Neutral termination may omitted or otherwise not available at the load.

In IT environments, the equipment to be protected from power outages often is disposed in conventional nineteen-inch IT racks in accordance with Electronic Industries Association Standard 310 (or EIA-310) and typically includes computing, storage and networking equipment. If the IT environment is not provided with a centralized UPS system, a backup power solution can be provided in each IT rack. Providing a backup power solution in each IT rack, however, is not always best choice because conventional rack-based backup power gears can be an expensive solution, consume valuable space within the IT rack and may not be electrically efficient.

In view of the foregoing, a need exists for an improved systems and methods for generating in-rack AC voltage during power grid outages that overcomes the aforementioned obstacles and deficiencies of currently-available rack-based AC backup power solutions.

BRIEF DESCRIPTION OF THE DRAWINGS

FIG. 4B is an exemplary detail drawing illustrating a front view of the power generation system of FIG. 3.

FIG. 4C is an exemplary detail drawing illustrating a back view of the power generation system of FIG. 3.

FIG. 4D is an exemplary detail drawing illustrating an alternative embodiment of the back view of the power generation system of FIG. 4C.

Figure 1:
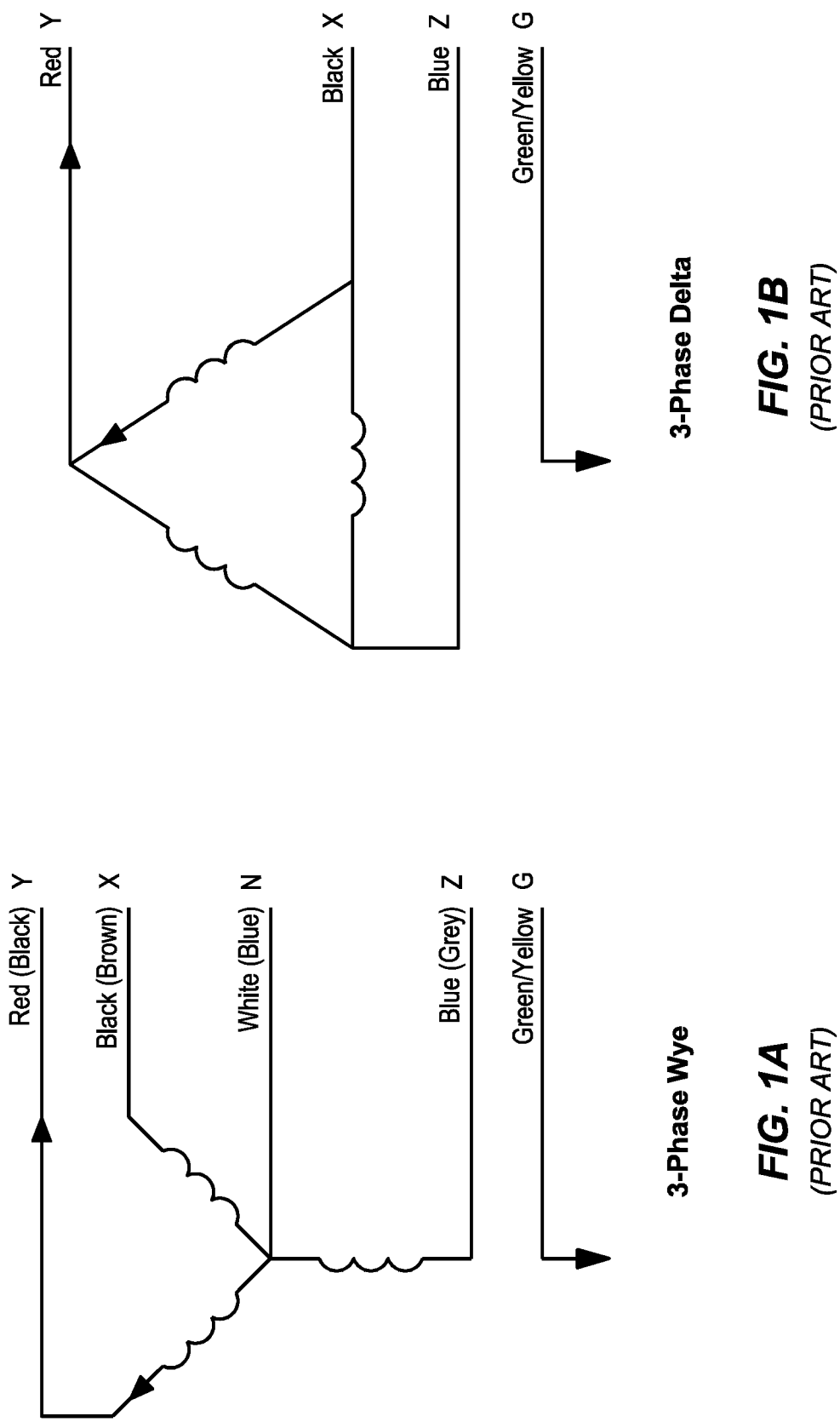
FIG. 1A is a detail diagram illustrating a conventional three-phase AC power system in a Wye configuration.
FIG. 1B is a detail diagram illustrating a conventional three-phase AC power system in a Delta configuration.

It should be noted that the figures are not drawn to scale and that elements of similar structures or functions may be generally represented by like reference numerals for illustrative purposes throughout the figures. It also should be noted that the figures are only intended to facilitate the description of the preferred embodiments. The figures do not illustrate every aspect of the described embodiments and do not limit the scope of the present disclosure.

DETAILED DESCRIPTION OF THE PREFERRED EMBODIMENTS

Since currently-available rack-based backup power solutions are expensive, consume valuable space within standard information technology (IT) racks, and are often electrically inefficient, an improved system and method for in-rack generation of alternating current (AC) power during power grid outages can prove desirable, and provide a basis for a wide range of system applications such as within IT environments and other mission-critical facilities. This result can be achieved, according to selected embodiments disclosed herein, by a power generation system 100 as illustrated in FIG. 2.

Figure 2:
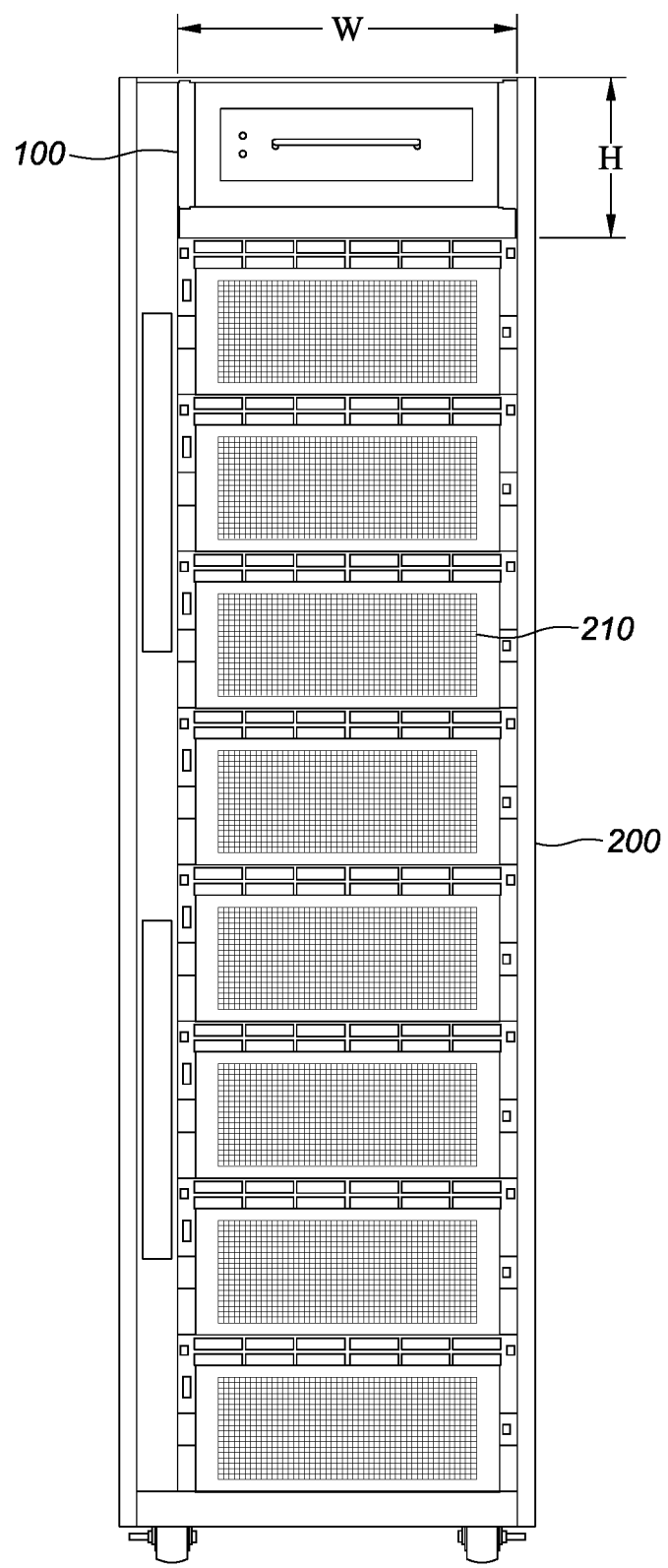
FIG. 2 is an exemplary high-level drawing illustrating an embodiment of a power generation system, wherein the power generation system is shown as being installable in a standard information technology rack.

Turning to FIG. 2, the power generation system 100 can be configured to provide backup alternating current (AC) power during power grid outages and is shown as being disposed in a chassis (or housing) that is suitable for installation in a standard information technology (IT) rack 200. If the standard rack 200 comprises a conventional nineteen-inch IT rack in accordance with Electronic Industries Association Standard 310 (or EIA-310), for example, the chassis can have a predetermined width W, such as a width of approximately 17.1", for enabling ready installation of the power generation system 100 within the standard rack 200. Exemplary other conventional racks can include Open 19 rack and/or Open Rack. The power generation system 100 thereby can advantageously be configured to provide backup AC power to other equipment 210 disposed in the standard rack 200 in the event of a power grid outage.

Additionally and/or alternatively, the chassis can have a predetermined height H. The predetermined height H of the chassis preferably is minimized to avoid the power generation system 100 from consuming valuable space for other equipment 210 within the standard rack 200. If the standard rack 200 comprises a conventional nineteen-inch IT rack in accordance with the EIA-310 standard, a standard unit 'U' of vertical rack space is equal to 1.75 inches with further steps of 0.5 U. The predetermined height H of the chassis can be between 2 U (3.5 inches) and 6 U (10.5 inches) in selected embodiments. Accordingly, the power generation system 100 can be configured to provide backup AC power to other equipment 210 in the event of a power grid outage without consuming valuable space within the standard rack 200.

Advantageously, deployment of the power generation system 100 within the standard rack 200 is good choice when installed in an IT environment regardless the presence of a facility (or room) AC UPS. In this embodiment, for example, the IT rack 200 can act like a big, powerful laptop computer with its own batteries, wherein the amount of batteries deployed dictates the duration of the backup. Batteries recharging circuitry and a DC-AC power inverter preferably are included in the power generation system 100.

Figure 3:
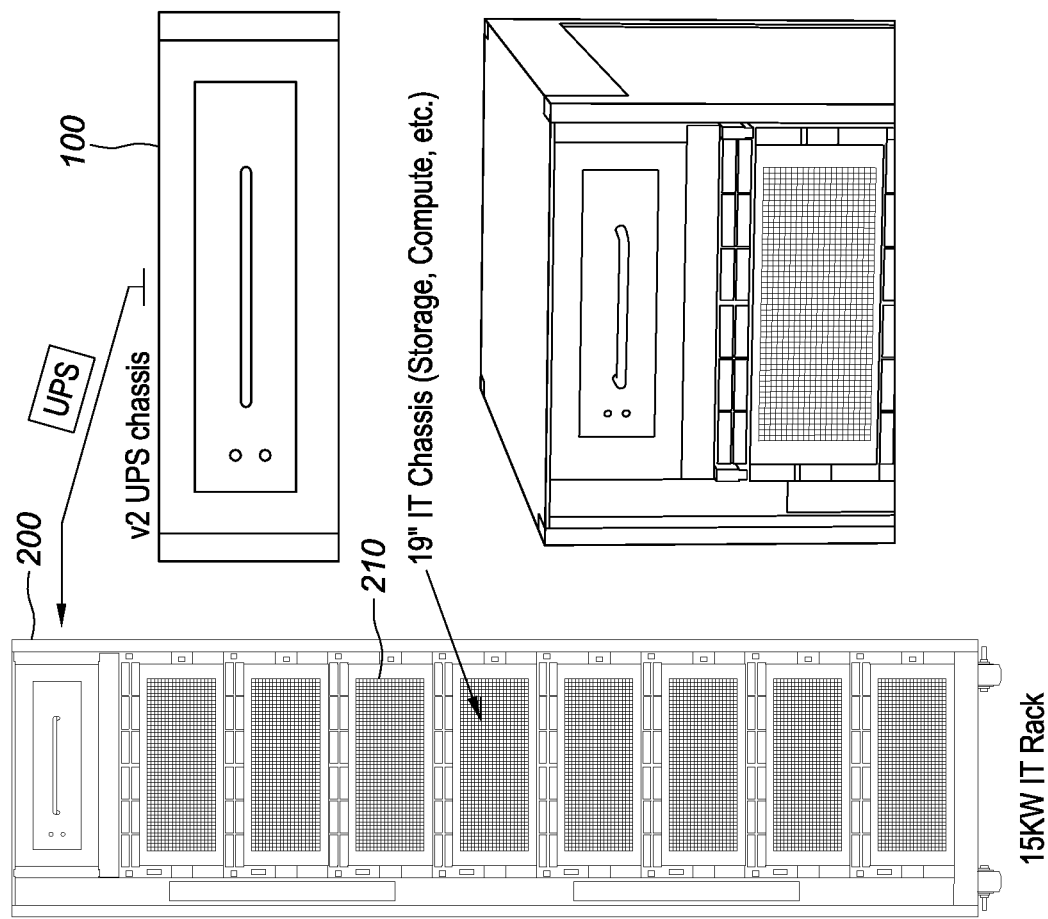
FIG. 3 is an exemplary detail drawing illustrating an alternative embodiment of the power generation system of FIG. 2.

FIG. 3 illustrates that the power generation system 100 can be disposed within a nineteen inch IT chassis optionally with one or more storage, compute and other equipment 210 (or other system resources).

Figure 4A:
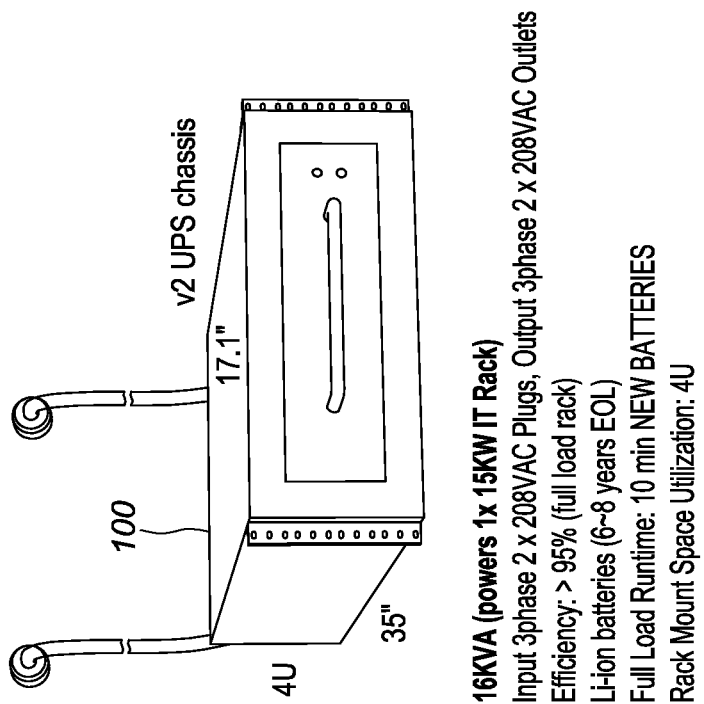
FIG. 4A is an exemplary detail drawing illustrating a perspective view of the power generation system of FIG. 3.

In the embodiment of FIG. 4A, the power generation system 100 can comprise a 16 KVA power generation system. In this embodiment, an input of the power generation system 100 can include an input with one or more three-phase plugs and/or an output with one or more three-phase plugs. Each input plug, for example, can receive an input voltage of 208 VAC. Additionally and/or alternatively, each output plug can comprise a 208 VAC output outlet. In selected embodiments, the power generation system 100 of FIG. 4A can provide an efficiency of at least 95% (or more) at full rack load and/or with a full-load run time of ten minutes or more with new batteries. The power generation system 100 optionally can be provided with a rack mount space utilization of 4U or better.

Additionally and/or alternatively, if the AC power provided by the AC power grid comprises three-phase 208 VAC Line-to-Line power, the power generation system 100 of FIG. 4D can include one or more three-phase input and/or output plugs with a nominal current rating of fifty amperes. In other words, a load between the output plugs can draw up to fifty amperes of current. In this embodiment, a neutral termination of the three-phase AC grid power is not available for use with the power generation system 100. The power generation system 100 optionally can include at least one 50 A circuit breakers. One or more fans can provide airflow for cooling the power generation system 100.

Figure 5A:
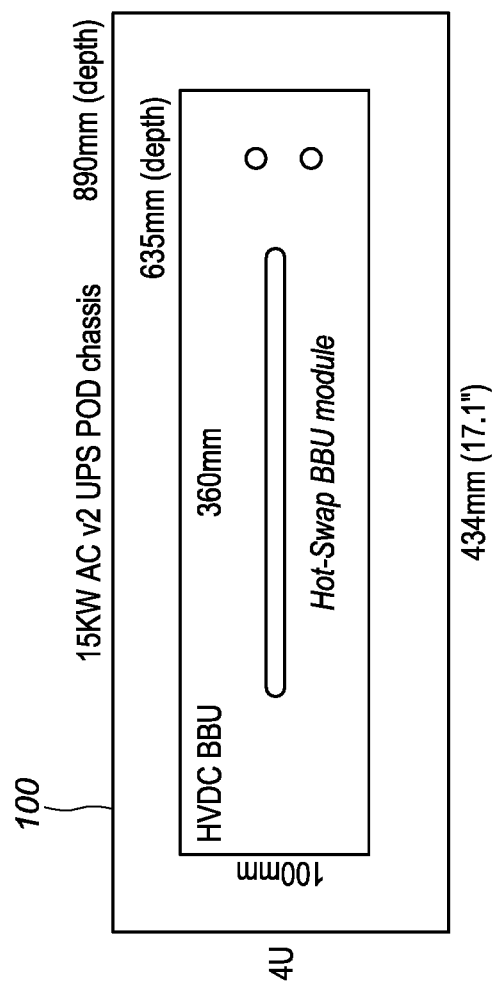
FIG. 5A is an exemplary detail drawing illustrating the front view of the power generation system of FIG. 4B, wherein the detail drawing includes illustrative mechanical dimensions for the power generation system and a high level overview information.
Figure 5C:
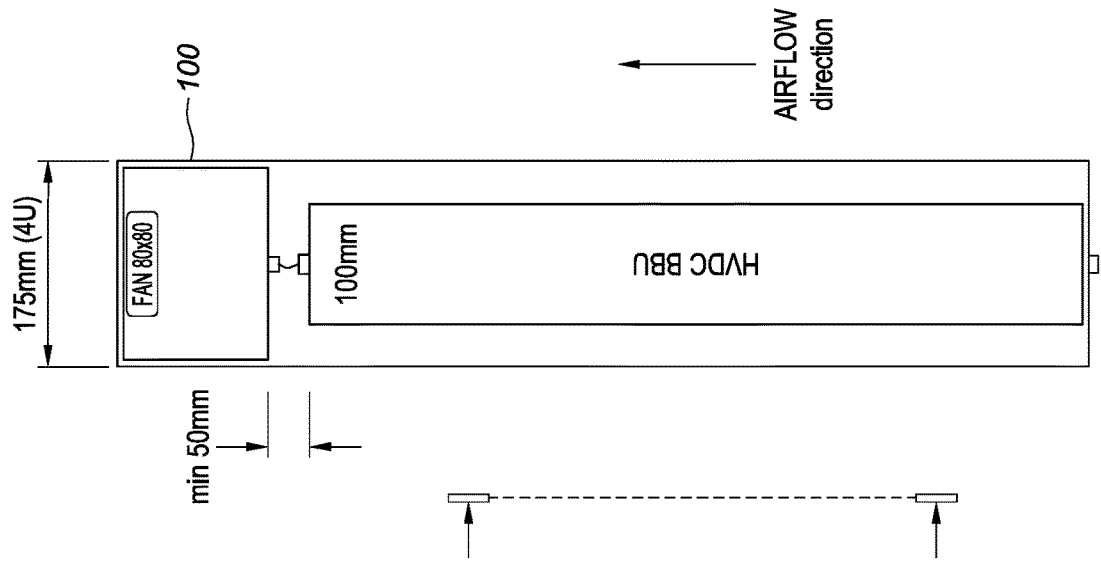
FIG. 5C is an exemplary detail drawing illustrating a side view of the power generation system of FIG. 5A, wherein the detail drawing includes illustrative mechanical dimensions for the power generation system.
Figure 5B:
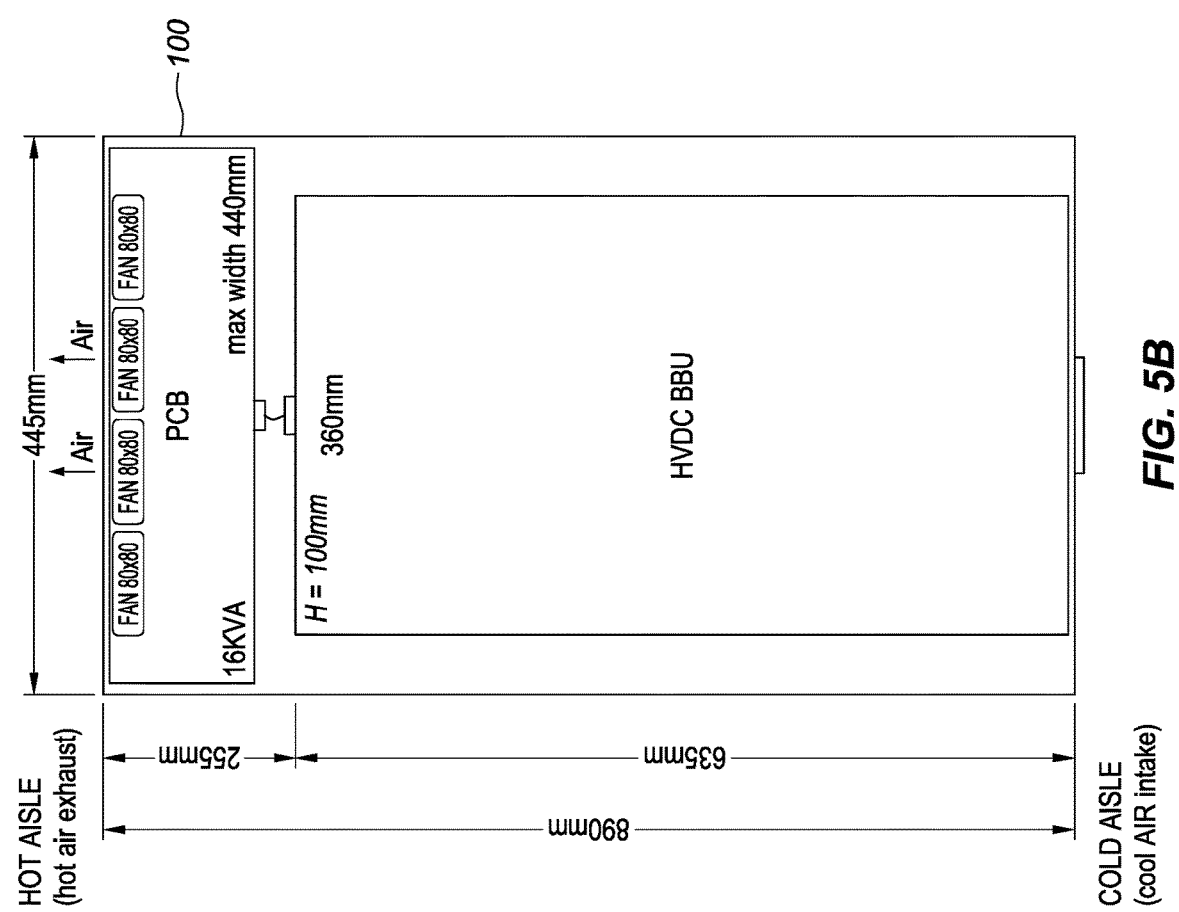
FIG. 5B is an exemplary detail drawing illustrating a top view of the power generation system of FIG. 5A, wherein the detail drawing includes illustrative mechanical dimensions for the power generation system.

The power generation system 100 of FIG. 5A, for example, can be provided as a 15 KW UPS Pod. Stated somewhat differently, a low voltage DC side of the power generation system 100 of FIG. 5A can have a maximum power rating of 15 KW for providing power to the IT rack 200 (shown in FIG. 2). The power generation system 100 thereby can comprise a high-voltage chassis for providing alternating current (or AC) UPS in-rack back-up power. As illustrated in FIG. 5A, the power generation system 100 advantageously can be disposed in a rack mount chassis with predetermined height H (shown in FIG. 2). The predetermined height H can comprise any suitable height and, in some embodiments, can be between 2 U (3.5 inches) and 6 U (10.5 inches). Preferably, the predetermined height H can be 4 U (7.0 inches).

By being disposed in the rack mount chassis, the power generation system 100 can be installed in any standard IT rack 200 and provide power backup functions to equipment 210 (shown in FIG. 2) mounted in the IT rack 200. In selected embodiments, the power generation system 100 can provide power backup functions only to equipment 210 mounted in the IT rack 200. The power generation system 100 optionally can provide power backup functions to equipment 210 mounted in one or more IT racks 200.

In operation, the power generation system 100 can provide the power backup functions for a preselected time duration to the IT rack 200 with a predetermined rack load. The power generation system 100, for example, can be configured to provide at least ten minutes (or more) of power backup time for a selected IT rack 200 that is loaded with to a maximum of 15 KW. Advantageously, the power generation system 100 optionally can provide the power backup functions for the preselected time duration without requiring modification to the IT rack power design, the equipment 210 mounted in the IT rack 200 and/or IT power supplies.

Figure 6A:
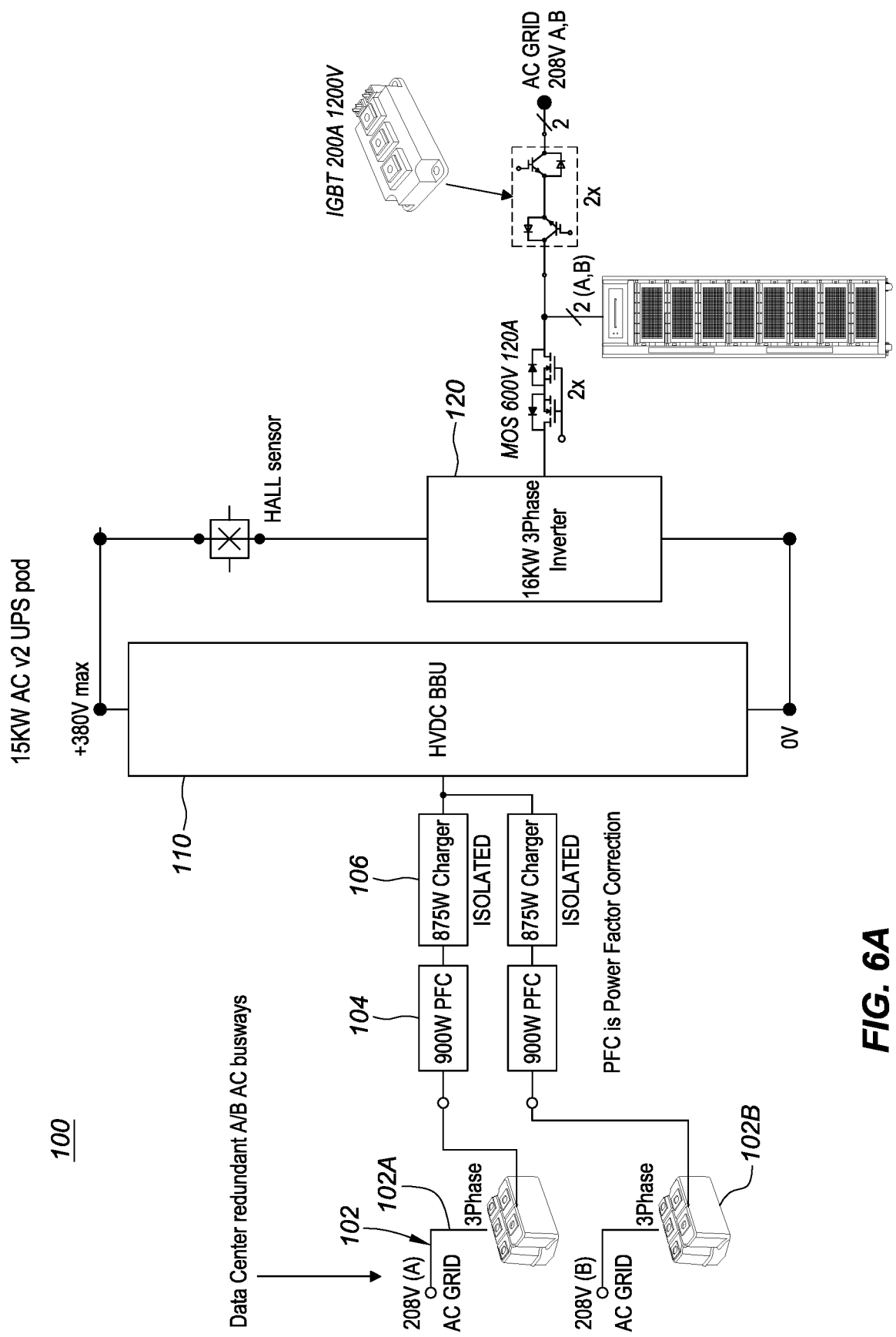
FIG. 6A is an exemplary detail diagram illustrating another alternative embodiment of the power generation system of FIG. 2, wherein the power generation system includes a battery backup unit and a power inverter.

Turning to FIG. 6A, the power generation system 100 is shown as including a high voltage direct current (HVDC) battery backup unit (BBU) apparatus 110 and a power inverter apparatus 120. The BBU apparatus 110 and the power inverter apparatus 120 can be coupled via an optional Hall sensor. In selected embodiments, the BBU apparatus 110 can include one or more lithium (Li)-Ion cells. The BBU apparatus 110, for example, can comprise one or more custom HVDC Li-Ion BBUs each with an output voltage of about 380 VDC when fully charged. Li-Ion cells advantageously have a high energy density, are reliable, and have a long life. The choice can vary between cylindrical cells type and prismatic cells type, and also for various flavors of exact chemistry.

The BBU apparatus 110 can receive AC power, such as three-phase 208 VAC Line-to-Line power, from the AC power grid. As shown in FIG. 6A, the BBU apparatus 110 can receive the AC power from the AC power grid from two or more redundant AC busways 102, such as first AC busway 102A and second AC busway 102B. In selected embodiments, the BBU apparatus 110 can receive the AC power grid via a power factor correction (PFC) system 104 and/or an isolated charger system 106.

The BBU apparatus 110 can convert (and/or store) the AC grid power as DC power and can provide the stored DC power to the power inverter apparatus 120, which optionally can be provided as a simplified UPS circuit. Upon detection of a grid power outage, the power inverter apparatus 120 can be activated to provide the power backup functions to the equipment 210 mounted in the one or more IT racks 200. The power generation system 100 thereby can provide continuity of AC power to the IT racks 200 without interruption of service.

In selected embodiments, a transition time for the power generation system 100 to be activated for providing the power backup functions to the IT racks 200 can be twenty milliseconds or less. The backup transition preferably can be implemented via solid state Automatic Transfer Switch (ATS) circuitry. Exemplary ATS circuitry can include, but is not limited to, one or more insulated-gate bipolar transistors (IGBTs) and/or one or more metal-oxide semiconductor field-effect transistor (MOSFETs). The transition time can be based, for example, upon a hold-up time of a power supply, such as a power distribution unit (PDU) 220 (shown in FIG. 8), installed in the IT rack 200.

The hold-up time is a capability of the power supply used in the IT rack 200 to keep running at full load when in AC power from the AC power grid is lost or becomes otherwise unavailable. If the power generation system 100 provides power to three IT racks 200, for instance, the transition time can be three times the hold-up time of the power supply for each IT rack 200. If the hold-up time for each power supply is twenty seconds, the total transition time can be three times twenty seconds, or sixty seconds.

Figure 6B:
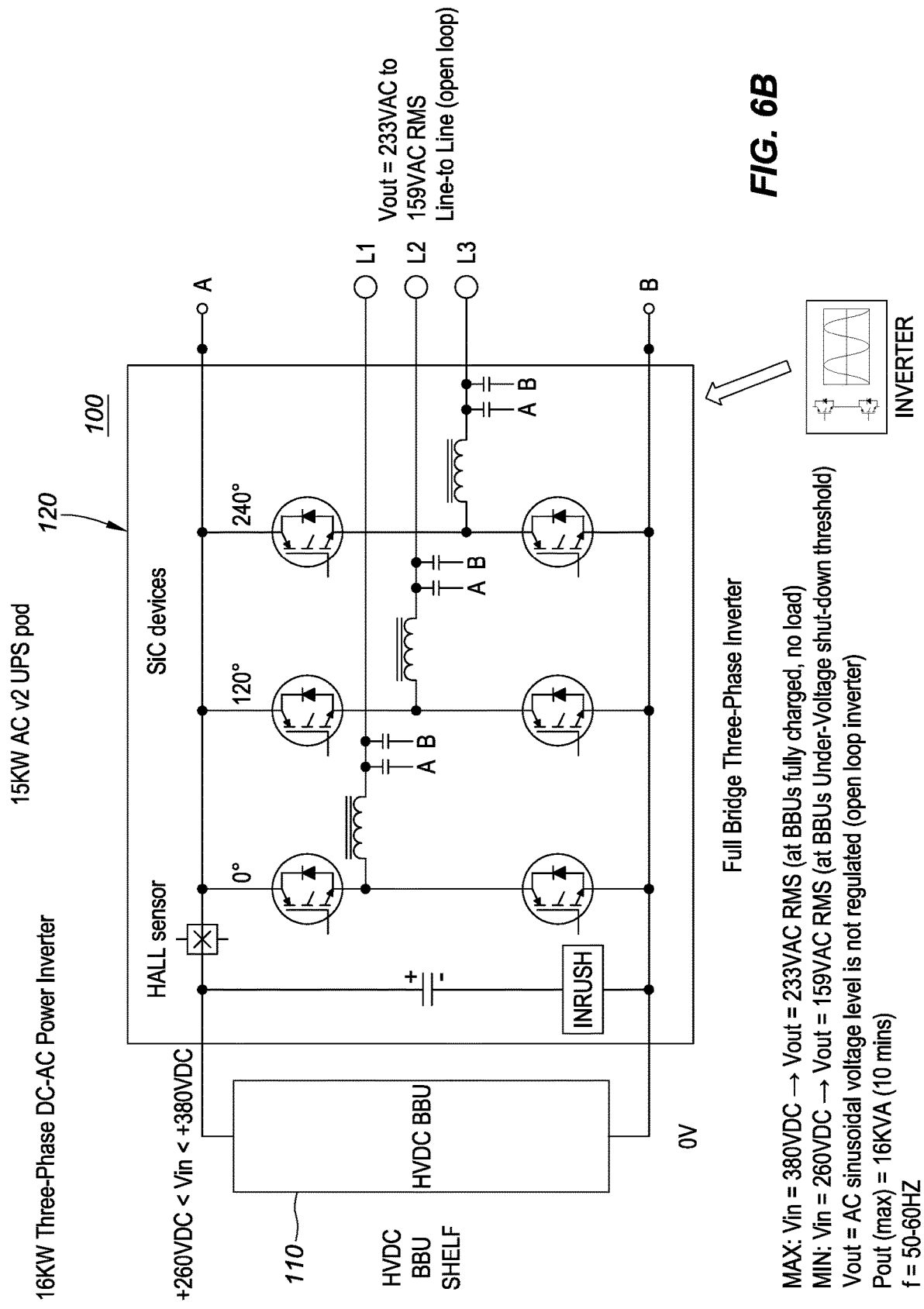
FIG. 6B is an exemplary detail drawing illustrating an alternative embodiment of the power generation system of FIG. 6A, wherein exemplary circuitry for the power inverter is shown.

FIG. 6B illustrates an exemplary embodiment of the power generation system 100. Turning to FIG. 6B, the power generation system 100 is shown as having an input voltage Vin and providing an output voltage Vout. The output voltage Vout preferably comprises an AC sinusoidal voltage level that is not regulated. In other words, the power inverter apparatus 120 can be provided as an open-loop power inverter.

In selected embodiments, the input voltage Vin can have a maximum voltage value of 380 VDC. The power generation system 100 can receive the input voltage Vin and can provide the output voltage Vout with a value of 233 VAC RMS at a predetermined frequency between 50 Hz and 60 Hz if, for example, the BBU apparatus 110 is fully charged such that the power generation system 100 is not loaded. Additionally and/or alternatively, the input voltage Vin can have a minimum voltage value of 260 VDC. The power generation system 100 can receive the input voltage Vin and can provide the output voltage Vout with a value of 159 VAC RMS at a predetermined frequency between 50 Hz and 60 Hz if, for example, the BBU apparatus 110 is operating at an under-voltage shutdown threshold. The power generation system 100 of FIG. 6B advantageously can provide a maximum power output of 15 KW for at least ten minutes or more.

Figure 7:
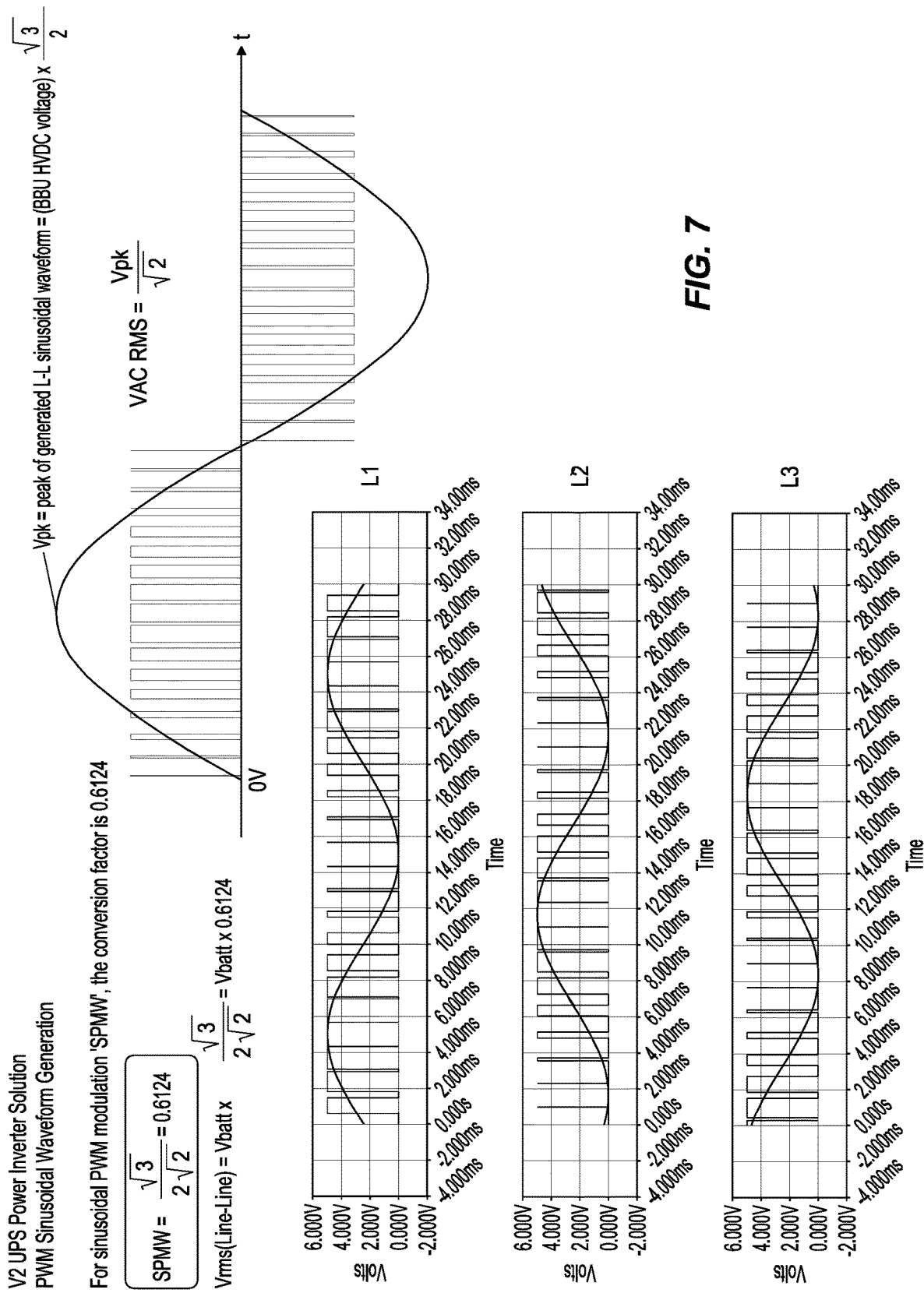
FIG. 7 is an exemplary detail diagram illustrating operational details of the embodiment of the power inverter shown in FIG. 6B.

FIG. 7 shows exemplary operational details of the power inverter apparatus 120 (shown in FIG. 6A). As shown in FIG. 7, the power inverter apparatus 120 can provide a UPS power inverter solution for generating a pulse width modulated (PWM) sinusoidal waveform. The power inverter apparatus 120, in other words, can provide sinusoidal pulse width modulation (SPWM). In selected embodiments, the power inverter apparatus 120 can provide the PWM sinusoidal waveform with a conversion factor as shown in Equation 1.

$$\text{Conversion Factor} = \frac{\sqrt{3}}{2*\sqrt{2}} = 0.6124 \qquad \text{(Equation 1)}$$

A Line-to-Line output voltage Vrms (Line-to-Line) generated by the power inverter apparatus 120 can be a function of the output voltage $V_{BBU}$ of the BBU apparatus 110 (shown in FIG. 6A). In selected embodiments, the Line-to-Line output voltage Vrms (Line-to-Line) generated by the power inverter apparatus 120 can be determined in the manner as shown below in Equation 2.

$$\text{Vrms (Line-to-Line)} = \frac{\sqrt{3}}{2*\sqrt{2}} * V_{BBU} = 0.6124 * V_{BBU} \qquad \text{(Equation 2)}$$

Additionally and/or alternatively, a peak output voltage Vpeak generated by the power inverter apparatus 120 likewise can be a function of the output voltage $V_{BBU}$ of the BBU apparatus 110. In selected embodiments, the peak output voltage Vpeak generated by the power inverter apparatus 120 can be determined in the manner as shown below in Equation 3.

$$\text{Vpeak} = \frac{\sqrt{3}}{2} * V_{BBU} \qquad \text{(Equation 3)}$$

An output voltage Vrms generated by the power inverter apparatus 120 can be a function of the peak output voltage Vpeak. In selected embodiments, the output voltage Vrms generated by the power inverter apparatus 120 can be determined in the manner as shown below in Equation 4.

$$\text{Vrms} = \frac{\text{Vpeak}}{\sqrt{2}} \qquad \text{(Equation 4)}$$

As shown in FIG. 7, the power inverter apparatus 120 can generate three sinusoidal waveforms L1, L2, L3 from the output voltage $V_{BBU}$ of the BBU apparatus 110. The sinusoidal waveforms L1, L2, L3 can include pulse width modulation and, as illustrated in FIG. 7, between spaced apart in phase by 120 degrees. Via use of sinusoidal pulse width modulation, the power inverter apparatus 120 advantageously can generate the sinusoidal waveforms L1, L2, L3 with fewer harmonics, resulting in a clean sinusoidal waveform. The power inverter apparatus 120 likewise can utilize sinusoidal pulse width modulation to reduce switching losses, reduce common mode noise issues and simply implementation of inverter system control.

Figure 8:
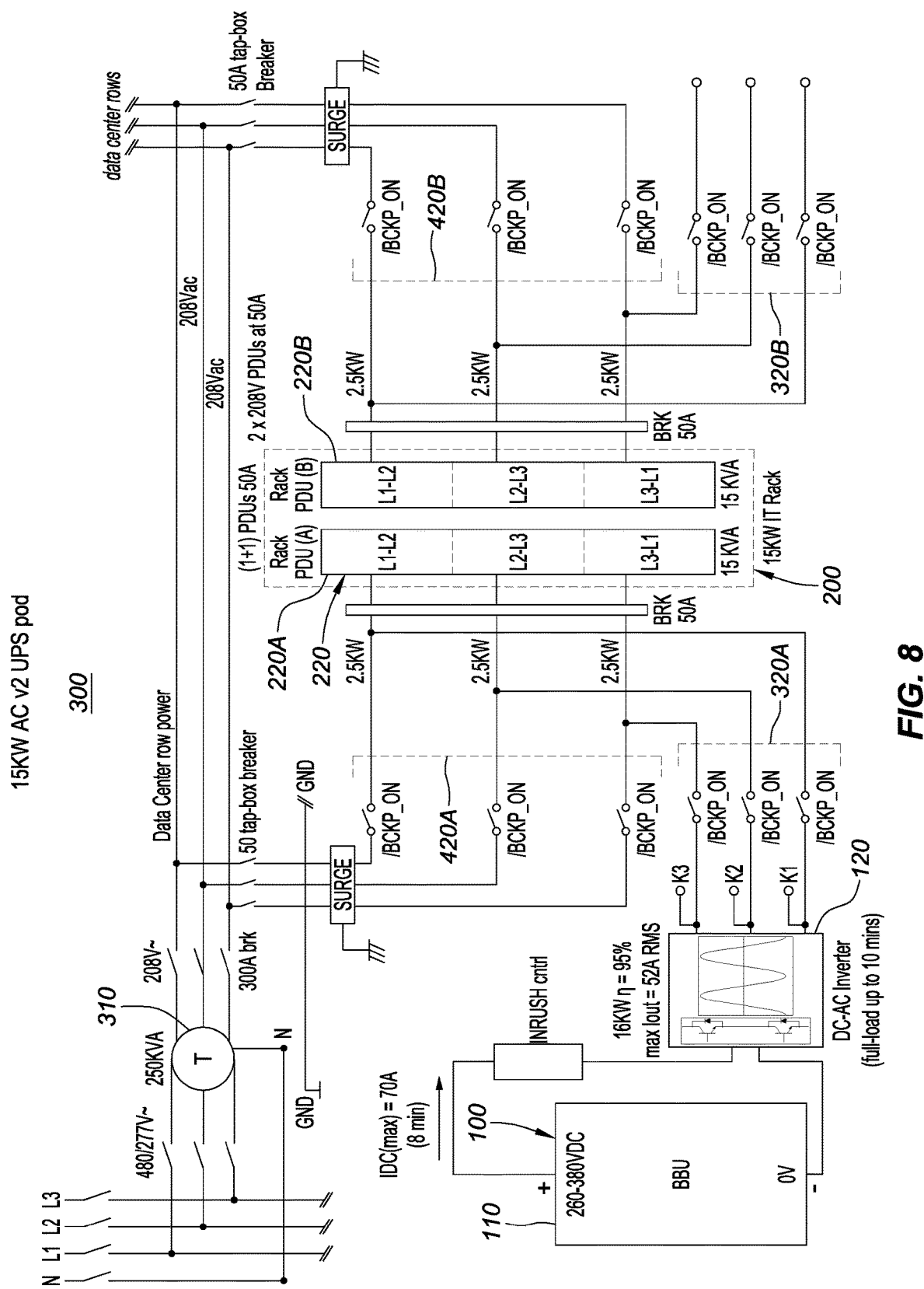
FIG. 8 is an exemplary block diagram illustrating an embodiment of the power generation system shown in FIGS. 6A-B, wherein the power generation system is installed to racks deployed into an information technology (IT) environment.

An exemplary installation of the power generation system 100 within an information technology (IT) environment 300 is shown in FIG. 8. Turning to FIG. 8, the IT environment 300 is shown as including one or more standard racks 200, widely used for the deployment of networking, compute, storage and other equipment 210 (shown in FIG. 2) in the manner set forth herein. The standard racks 200 normally include two AC power distribution units (PDUs) 220 for distributing AC voltage to the IT chassis installed in standard racks 200, using a (1+1) redundant power scheme. In the (1+1) redundant power scheme, a transition time for the power generation system 100 to be activated for providing the power backup functions to the IT racks 200 can be forty milliseconds or less, which can be based, for example, upon a hold-up time of the redundant power distribution units (PDUs) 220.

If the feed of a first PDU 220A is lost (or if the first PDU 220A fails), a second PDU 220B can carry the full rack load without service interruption. All of the IT chassis in the rack advantageously can implement the (1+1) redundant power scheme, so always including inside two power supplies of same rating with outputs connected in parallel. Each power supply can carry alone the full load of its IT chassis and is connected to one of the two PDUs 220 (shown in FIG. 8) in the rack 200 for complete redundancy. With this redundant configuration, each power supply in the IT chassis preferably (normally) provides less than 50% of its maximum power rating to the chassis load, due to the (1+1) redundant power scheme.

In selected embodiments, the standard racks 200 can use a different power scheme compared to the traditional power scheme involving two AC PDUs 220 in the standard racks 200 and AC-DC power supplies inside the IT chassis. For example, AC-DC power shelves can be installed in the standard racks 200 and connect their low-voltage DC output (typically 12V or 48V) to ALL of the IT equipment 210 (shown in FIG. 2) installed in the standard racks 200, using bus-bars and/or cables for DC voltage distribution. In this example, the UPS could be either AC or DC, depending whether the backup is provided on the AC side or on the common DC side. In those configurations, the redundant AC PDUs 220 are not utilized, and no AC-DC power supplies are installed in the IT chassis. Instead, a centralized AC-DC power shelf (or shelves) and a low voltage distribution system is used. The power generation system 100 advantageously can comprise an in-rack AC UPS for standard 19" EIA-310 rack solutions with two AC PDUs 220 and with IT chassis including (1+1) AC-DC power supplies.

As set forth herein, the power generation system 100 can provide a compact rack-mountable AC UPS solution that is inexpensive, reliable, efficient and/or completely compatible with any 19" EIA-310 racks 200 with two redundant AC PDUs 220 as per the IT industry standard implementation. The power generation system 100 preferably is implemented for a device with max IT rack power rated 15 KW, but could also be for higher power levels. The power generation system 100, for example, can support the most widely use system configuration in the United States of a 208V Wye (Line-to-Line). This use case can present difficulties in implementation because the Neutral conductor is not present. Additionally and/or alternatively, the power generation system 100 can include a high-voltage hot-swappable BBU apparatus 110 for energy storage using '18650' Li-Ion cells at high energy density, with low parasitic internal resistance.

The power generation system 100 can be an offline device in selected embodiments. Thereby, the power generation system 100 can transfer AC voltage to both AC PDUs 220 installed in the standard rack 200, preferably only when AC power grid outage occurs. The power generation system 100 optionally can include one or more solid state switches 320. Solid state switches 320A, 320B (shown in FIG. 8), for example, can switch the output of the inverter apparatus 120 to the rack PDUs 220 at the time the AC grid outage occurs; whereas, solid state switches 420A, 420B (shown in FIG. 8) can isolate the front-end on AC grid side at the same time. Exemplary solid state switches 320A-B and 420A-B can include, but are not limited to, insulated-gate bipolar transistors (IGBTs) and/or metal-oxide semiconductor field-effect transistor (MOSFETs).

The power inverter apparatus 120 of the power generation system 100 preferably includes an unregulated three-phase DC-AC Inverter in selected embodiments. Since the output of the DC-AC inverter apparatus 120 is unregulated, the circuitry of the power inverter apparatus 120 advantageously can be simplified. The power inverter apparatus 120, for example, does not require a front-end stage and/or power transformers for isolation. Simplification of the power inverter apparatus 120 likewise can lead to an increase of efficiency of the power generation system 100 with the number of components (cost) being lower and/or the energy extracted from the batteries being maximized. The BBU apparatus 110 provides a high-voltage direct-current to the power inverter apparatus 120, which converts the direct current into an alternating-current, such as three-phase 208V Line-to-Line, 60 Hz, that is provided by the power inverter apparatus 120 to the standard rack 200.

During a power backup phase, the output AC voltage of the power inverter apparatus 120, being non-regulated, advantageously starts high but then steadily lowers down towards lower voltage levels. This feature of the power inverter apparatus 120 can be exploited within the IT environment 300 for a peculiar characteristic of the load (e.g., the input of all AC-DC power supplies in the IT chassis in the standard rack 200 and powered by the power inverter apparatus 120). The AC-DC power supplies can be 'Full-Range' type supplies and thereby able to work from a minimum input voltage level of 90V AC RMS, whereas 90-264V is standard full-range. At AC power grid outage, those supplies can see a transferred AC voltage that jumps from a normal 208V grid voltage value to a short-term higher value, such as 240V, and then lowering down toward much lower levels during the backup phase under load, which can last several minutes in some embodiments.

In the manner shown in FIG. 8, the standard racks 200 within a selected IT environment 300 can be deployed with a (1+1) redundant power scheme and/or can comprise full-range devices that can be capable of working from 90 VAC to 264 VAC. The output maximum power rating of full-range power supplies typically are derated when input AC voltage drops below a certain threshold, such as below ~170V AC RMS. This derating is normal since a front-end stage of the power supplies may not be able to endure the very high input AC current at full load when the input AC voltage lowers too much. The power supplies preferably are utilized between 200-240 VAC to take advantage of the full power rating capabilities.

The derating at low input AC voltage can be as much as 50%, but this derating does not represent an issue in the IT environment 300 of FIG. 8 since the (1+1) redundant power scheme advantageously can prevent any of the power supplies from delivering more than 50% of its max power rating for the high input voltage case. Additionally and/or alternatively, during backup phase, the input voltage of one or more of the power supplies could go as low as 100 VAC without service interruption as long as the (1+1) redundant power scheme is maintained. In case the redundancy at IT chassis level is lost for any reason, that particular chassis may experience a reduced backup duration during power outages, depending on its actual load. In case the redundancy at IT rack level is lost for any reason, that particular rack may experience a reduced backup duration during power outages, depending on its actual load. A loss of redundancy in one IT rack will not impact backup operations statistically, even though the 'system availability' cannot be mathematically be asserted to be 'near unity' even over a large population of racks.

In operation, the power inverter apparatus 120 of the power generation system 100 preferably is always active but not loaded. The power loss due to this standby mode is very minimal. The batteries of the BBU apparatus 110 can be charged when the power inverter apparatus 120 is in the standby mode and so when the power grid is available. The power generation system 100 advantageously detects an occurrence of an AC power grid outage, typically in less than five milliseconds. Upon detecting the occurrence of the AC power grid outage, the solid state switches 420A, 420B on the AC grid input side of the standard rack 200 can be transitioned to an off-state to insulate the output of the power inverter apparatus 120 from the AC grid power network, and the solid state switches 320A, 320B can be transitioned to an on-state to keep the power running in to the IT rack 200 from the power inverter apparatus 120, with energy from the batteries of the BBU apparatus 110.

Each transition must happen within a time interval of no more than twenty milliseconds. In some cases, a small glitch of the input AC voltage may result during transitions but typically is not an issue for the load power supplies. In case of an AC grid outage, the (1+1) redundant power scheme advantageously enables the power supplies installed in the IT chassis to keep powering the chassis for at least forty milliseconds. This feature allows the standard rack 200 to keep running flawlessly during the transition from being powered by the AC power grid to being powered by the power generation system 100.

When the power from the AC grid is restored, the transition is reversed going back to AC grid again, and the batteries of the BBU apparatus 110 can be recharged.

As used herein, a phrase in the form of at least one of A, B, C and D herein is to be construed as meaning one or more of A, one or more of B, one or more of C and/or one or more of D.

The described embodiments are susceptible to various modifications and alternative forms, and specific examples thereof have been shown by way of example in the drawings and are herein described in detail. It should be understood, however, that the described embodiments are not to be limited to the particular forms or methods disclosed, but to the contrary, the present disclosure is to cover all modifications, equivalents, and alternatives.

What is claimed is:

1. A power generation system for providing backup alternating current power to rack equipment disposed within an information technology (IT) rack during an outage of a power grid, comprising:
   a housing being configured for installation in the IT rack; and
   a high voltage direct current (HVDC) battery backup apparatus being disposed within said housing and being configured to provide direct-current output power; and
   a power inverter apparatus being disposed within said housing, being configured to convert the direct-current output power into an alternating-current voltage and alternating between a standby mode and an active mode; and
   one or more first switches coupling the rack equipment with the power grid and one or more second switches coupling the rack equipment with said power inverter apparatus,
   wherein, when the power grid becomes available, said HVDC battery backup apparatus is charged via the power grid, said power inverter apparatus enters the standby mode and the rack equipment receives power from the power grid, whereby said first switches close and said second switches open to enable the rack equipment to receive the power from the power grid, and
   wherein, when the power grid becomes unavailable, said power inverter apparatus enters the active mode and provides the alternating-current voltage to the rack equipment, wherein said first switches open and said second switches close in a time interval between one millisecond and twenty milliseconds, inclusive, of the power grid becoming unavailable to enable the rack equipment to receive the alternating-current voltage from said power inverter apparatus.

2. The power generation system of claim 1, wherein said housing has a predetermined width for installation in a standard IT rack.

3. The power generation system of claim 2, wherein said housing has a predetermined height between 3.5 inches and 10.5 inches, inclusive.

4. The power generation system of claim 1, wherein said HVDC battery backup apparatus includes one or more lithium-ion cells.

5. The power generation system of claim 4, wherein said lithium-ion cells comprise at least one lithium-ion cell of a cylindrical cell type, at least one of a lithium-ion cell of a prismatic cell type or a combination thereof.

6. The power generation system of claim 1, wherein said power inverter apparatus remains active to convert the high-voltage direct-current output power into the alternating-current voltage without providing the alternating-current voltage to the rack equipment when the power grid becomes available.

7. The power generation system of claim 1, wherein said power inverter apparatus comprises a direct current to unregulated three-phase alternating current power inverter apparatus that provides unregulated three-phase alternating current voltage to the rack equipment when the power grid becomes unavailable.

8. The power generation system of claim 7, wherein the unregulated three-phase alternating current voltage comprises three-phase 208V Line-to-Line voltage with a frequency between 50 Hz and 60 Hz, inclusive.

9. The power generation system of claim 7, wherein each phase of the unregulated three-phase alternating current voltage comprises a pulse width modulated sinusoidal waveform.

10. The power generation system of claim 1, wherein said first switches again close and said second switches again open to enable the rack equipment to receive the power from the power grid when the power grid again becomes available such that said HVDC battery backup apparatus is recharged via the power grid and said power inverter apparatus is in the standby mode.

11. The power generation system of claim 1, wherein said HVDC battery backup apparatus and said power inverter apparatus are coupled via an intermediate Hall sensor.

12. A method for providing backup alternating current power to first rack equipment disposed within a first information technology (IT) rack and to second rack equipment disposed within a second IT rack during an outage of a power grid, comprising:
   powering the first and second rack equipment and charging a first high voltage direct current (HVDC) battery backup apparatus disposed in the first IT rack and a second HVDC battery backup apparatus disposed in the second IT rack via a power grid while the power grid is available; and
   when the power grid is not available,
   converting first direct-current output power supplied by the first HVDC battery backup apparatus into a first unregulated three-phase alternating current voltage, each phase of the first unregulated three-phase alternating current voltage including a pulse width modulated sinusoidal waveform, and powering the first rack equipment via the first unregulated three-phase alternating current voltage;
   detecting an operational status of the second HVDC battery backup apparatus; based upon the detected operational status,
   powering the second rack equipment via the first alternating-current voltage upon detection of a failure of the second power generation system; and
   converting second direct-current output power supplied by the second HVDC battery backup apparatus into a second unregulated three-phase alternating current voltage, each phase of the second unregulated three-phase alternating current voltage including a pulse width modulated sinusoidal waveform, and powering the second rack equipment via the second unregulated three-phase alternating current voltage upon detection of no failure of the second power generation system.

13. A computer program product for providing backup alternating current power to first rack equipment disposed within a first information technology (IT) rack and to second rack equipment disposed within a second IT rack during an outage of a power grid, the computer program product being encoded on one or more non-transitory machine-readable storage media and comprising:
   instruction for powering the first and second rack equipment and charging first and second high voltage direct current (HVDC) battery backup apparatuses via a power grid while the power grid is available; and
   when the power grid is not available,
   instruction for converting first direct-current output power supplied by the first HVDC battery backup apparatus into a first alternating-current voltage via a first power inverter apparatus and powering the first rack equipment via the first alternating-current voltage;
   instruction for detecting an operational status of the second HVDC battery backup apparatus; and
   based upon the detected operational status,
   instruction for powering the second rack equipment via the first alternating-current voltage upon detection of a failure of the second power generation system; and
   instruction for converting second direct-current output power supplied by the second HVDC battery backup apparatus into a second alternating-current voltage via a second power inverter apparatus and powering the second rack equipment via the second alternating-current voltage upon detection of no failure of the second power generation system,
   wherein the first HVDC battery backup apparatus and the first power inverter apparatus are disposed within the first IT rack, and
   wherein the second HVDC battery backup apparatus and the second power inverter apparatus are disposed within the second IT rack.

* * * * *